(12) United States Patent
Tamaru et al.

(10) Patent No.: US 10,083,985 B2
(45) Date of Patent: Sep. 25, 2018

(54) SEMICONDUCTOR DEVICE

(71) Applicant: SOCIONEXT INC., Kanagawa (JP)

(72) Inventors: Masaki Tamaru, Kyoto (JP);
Kazuyuki Nakanishi, Kyoto (JP);
Hidetoshi Nishimura, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 16 days.

(21) Appl. No.: 15/651,818

(22) Filed: Jul. 17, 2017

(65) Prior Publication Data
US 2017/0317101 A1 Nov. 2, 2017

Related U.S. Application Data

(63) Continuation of application No. 15/147,656, filed on May 5, 2016, now Pat. No. 9,741,740, which is a (Continued)

(30) Foreign Application Priority Data

Dec. 25, 2009 (JP) ................................. 2009-294231

(51) Int. Cl.
H01L 27/02 (2006.01)
H01L 27/092 (2006.01)
(Continued)

(52) U.S. Cl.
CPC .... *H01L 27/11807* (2013.01); *H01L 27/0207* (2013.01); *H01L 27/0928* (2013.01);
(Continued)

(58) Field of Classification Search
CPC .............................. H01L 27/02; H01L 27/092
See application file for complete search history.

(56) References Cited

U.S. PATENT DOCUMENTS 4,661,815 A 4/1987 Takayama et al.
6,396,087 B1 5/2002 Kitabayashi et al.
(Continued)

FOREIGN PATENT DOCUMENTS

JP 61-099348 A 5/1986
JP 2001-148464 A 5/2001
(Continued)

OTHER PUBLICATIONS

U.S. Notice of Allowance dated Feb. 10, 2016 issued in U.S. Appl. No. 14/576,158.
(Continued)

*Primary Examiner* — Joseph C Nicely
*Assistant Examiner* — Lamont Koo
(74) *Attorney, Agent, or Firm* — McDermott Will & Emery LLP

(57) ABSTRACT

A well potential supply region is provided in an N-type well region of a cell array. Adjacent gates disposed in both sides of the well potential supply region in the horizontal direction and adjacent gates disposed in further both sides thereof are disposed at the same pitch. In addition, an adjacent cell array includes four gates each of which is opposed to the adjacent gates in the vertical direction. In other words, regularity in the shape of the gate patterns in the periphery of the well potential supply region is maintained.

18 Claims, 12 Drawing Sheets

Related U.S. Application Data continuation of application No. 14/576,158, filed on Dec. 18, 2014, now Pat. No. 9,362,264, which is a continuation of application No. 14/179,556, filed on Feb. 13, 2014, now Pat. No. 8,946,826, which is a continuation of application No. 13/421,010, filed on Mar. 15, 2012, now Pat. No. 8,692,336, which is a continuation of application No. PCT/JP2010/007255, filed on Dec. 14, 2010.

(51) Int. Cl.
  *H01L 27/118* (2006.01)
  *H01L 21/8238* (2006.01)

(52) U.S. Cl.
  CPC ... *H01L 27/11898* (2013.01); *H01L 21/823892* (2013.01); *H01L 2027/1189* (2013.01); *H01L 2027/11866* (2013.01); *H01L 2027/11881* (2013.01)

(56) References Cited

U.S. PATENT DOCUMENTS

| | | | |
|---|---|---|---|
| 7,205,191 B2 | 4/2007 | Kobayashi | |
| 2002/0064080 A1 | 5/2002 | Nii et al. | |
| 2005/0001271 A1 | 1/2005 | Kobayashi | |
| 2005/0274983 A1 | 12/2005 | Hayashi et al. | |
| 2005/0280031 A1 | 12/2005 | Yano | |
| 2006/0199325 A1* | 9/2006 | Maeno | H01L 27/11807 438/199 |
| 2007/0004147 A1 | 1/2007 | Toubou et al. | |
| 2008/0169868 A1 | 7/2008 | Toubou | |
| 2008/0224176 A1 | 9/2008 | Nakanishi et al. | |
| 2009/0134467 A1 | 5/2009 | Ishida et al. | |
| 2010/0006896 A1 | 1/2010 | Uemura | |
| 2010/0148235 A1 | 6/2010 | Toubou et al. | |
| 2010/0308377 A1 | 12/2010 | Nakanishi et al. | |
| 2011/0031536 A1 | 2/2011 | Okamoto et al. | |

FOREIGN PATENT DOCUMENTS

| | | |
|---|---|---|
| JP | 2003-309178 A | 10/2003 |
| JP | 2006-005103 A | 1/2006 |
| JP | 2007-012855 A | 1/2007 |
| JP | 2007-129094 A | 5/2007 |
| JP | 2008-235350 A | 10/2008 |
| JP | 2009-032961 A | 2/2009 |
| JP | 2009-267094 A | 11/2009 |
| JP | 05-082640 B2 | 11/2012 |

OTHER PUBLICATIONS

International Search Report issued in International Application No. PCT/JP2010/007255 dated Mar. 22, 2011.
Translation of the Chinese Search Report.
United States Office Action issued in U.S. Appl. No. 14/179,556 dated May 6, 2014.
U.S. Office Action dated Jul. 15, 2016 issued in U.S. Appl. No. 15/147,656.
U.S. Notice of Allowance dated Apr. 21, 2017 issued in U.S. Appl. No. 15/147,656.

* cited by examiner

SEMICONDUCTOR DEVICE

RELATED APPLICATIONS

This application is a continuation patent application of U.S. patent application Ser. No. 15/147,656, filed on May 5, 2016, which is a continuation of U.S. patent application Ser. No. 14/576,158, filed on Dec. 18, 2014, now patented as U.S. Pat. No. 9,362,264, which is a continuation of U.S. patent application Ser. No. 14/179,556, filed on Feb. 13, 2014, now patented as U.S. Pat. No. 8,946,826, which is a continuation of U.S. patent application Ser. No. 13/421,010, filed on Mar. 15, 2012, now patented as U.S. Pat. No. 8,692,336, which is a continuation of International Patent Application No. PCT/JP2010/007255, filed on Dec. 14, 2010, which in turn claims the benefit of Japanese Patent Application No. 2009-294231, filed on Dec. 25, 2009, the disclosure of which applications are incorporated by reference herein.

BACKGROUND

1. Technical Field

The present invention relates to a semiconductor device provided with a well potential supply region for supplying power to a well region.

2. Background Art

In a semiconductor device of the related art, there is provided a well potential supply region for supplying power to a well region in the vicinity of an active transistor for the purpose of controlling well potential, in other words, for the purpose of preventing latch-up. Furthermore, the "active transistor" refers to a transistor that contributes to a desired function of a circuit using the operation characteristic of the transistor.

FIG. 12 is a diagram showing an example of a layout of a semiconductor device of the related art, in which a well potential supply region is provided. In the configuration of FIG. 12, standard cell arrays in which a plurality of standard cells are disposed in the horizontal direction of the drawing are disposed by being arranged in the vertical direction of the drawing. In addition, in the standard cell array in the center, well potential supply cell VSC is inserted. VSCN is a well potential supply region (TAP region) for supplying well potential to an N-type well, in which N-type impurities are implanted and VSCP is a well potential supply region for supplying well potential to a P-type well, in which P-type impurities are implanted.

Refer to Unexamined Japanese Patent Publication No. 2008-235350, Unexamined Japanese Patent Publication No. 2007-12855, Unexamined Japanese Patent Publication No. 2001-148464, and Unexamined Japanese Patent Publication No. 2009-32961, for example.

SUMMARY

As semiconductor devices have progressed in miniaturization in recent years, the influence of an optical proximity effect caused by diffracted light increases when a gate is exposed. For this reason, there occurs a problem in that the influence of the optical proximity effect significantly differs depending on the state of peripheral gate patterns, and unevenness in the gate length occurs.

In order to take measures for the problem, it is necessary to secure regularity in the shapes of the gate patterns in the periphery of a target gate. In addition, it is necessary to maintain regularity in the shapes not only of the gate patterns arranged in the lateral direction of the target gate, but also of the gate patterns arranged in the longitudinal direction thereof.

However, when well potential supply cells are disposed in the related art, it is not possible to maintain regularity in the shapes of the gate patterns arranged in the lateral and longitudinal directions of the target gate. In the layout of FIG. 12 for example, by inserting well potential supply cell VSC, a gate is not closely disposed in the lower side of gate electrode GT5 and dummy gates GT4 and GT6 of the upper standard cell array, in addition, a gate is not closely disposed in the upper side of gate electrodes GB4, GB5, and GB6 of the lower standard cell array. In addition, a gate is not closely disposed in the right and left sides of respective gate electrodes GM3 and GM7. As such, by inserting the well potential supply cells VSC, regularity in the shapes of the peripheral gate patterns is not maintained.

Therefore, in a semiconductor device of the related art, it is necessary to dispose standard cells having active transistors avoiding the periphery of well potential supply cells VSC, in order to maintain regularity in the shapes of the gate patterns. In this case, however, an increase in the layout area of the semiconductor device is induced, which is not favorable.

Taking the above problem into consideration, the present invention aims to realize a semiconductor device having a well potential supply area while reliably suppressing unevenness in a gate length caused by the optical proximity effect without increasing the layout area.

According to an aspect of the present invention, there is provided a semiconductor device that includes a plurality of cell arrays, in which a plurality of gates extending in a first direction are arranged and disposed in a second direction orthogonal to the first direction, being arranged and disposed in the first direction, each of the plurality of cell arrays includes a first conductive type well region and a second conductive type well region which are formed below the gates and respectively extend in the second direction, a first cell array that is one of the plurality of cell arrays includes a first well potential supply region into which impurities of the same conductive type as that of the first conductive type well region are implanted in the first conductive type well region, first and second adjacent gates that are respectively disposed in both sides of the first well potential supply region in the second direction, a third adjacent gate that is disposed adjacent to the first adjacent gate in the opposite side to the first well potential supply region, and a fourth adjacent gate that is disposed adjacent to the second adjacent gate in the opposite side to the first well potential supply region, the first to the fourth adjacent gates are disposed at the same pitch in the second direction, and a first adjacent cell array adjacent to the first cell array in the first direction among the plurality of cell arrays includes four gates each of which is opposed to the first to the fourth adjacent gates in the first direction.

According to the aspect, the first well potential supply region is provided in the first conductive type well region of the first cell array. In addition, the first and the second adjacent gates disposed in the both sides of the first well potential supply region in the second direction and the third and the fourth adjacent gates disposed in further both sides thereof are disposed in the second direction at the same pitch. Furthermore, the first adjacent cell array adjacent to the first cell array in the first direction includes the four gates each of which is opposed to the first to the fourth adjacent gates in the first direction. In other words, regularity in the shapes of the gate patterns in the periphery of the first well potential supply region is maintained. Therefore, since it is possible to avoid the influence of an optical proximity effect differing depending on the gate patterns, it is possible to suppress an increase in the layout area resulting from the provision of the well potential supply region while reliably suppressing unevenness in the gate lengths.

According to another aspect of the present invention, there is provided a semiconductor device that includes a plurality of cell arrays, in which a plurality of gates extending in a first direction are arranged and disposed in a second direction orthogonal to the first direction, being arranged and disposed in the first direction, the plurality of cell arrays respectively include a first conductive type well region and a second conductive type well region that are formed below the gates and respectively extend in the second direction, and a first cell array that is one of the plurality of cell arrays includes a first well potential supply region into which impurities of the same conductive type as that of the first conductive type well region are implanted in the first conductive type well region, and a first gate disposed over the first well potential supply region.

According to the aspect, the first well potential supply region is provided in the first conductive type well region of the first cell array. In addition, the first gate is disposed over the first well potential supply region. With this configuration, it is possible to dispose the plurality of gates including the first gate in the second direction at the same pitch, and possible to be opposed to other gates in the first direction. In other words, it is possible to maintain regularity in the shapes of the gate patterns in the periphery of the first well potential supply region. Therefore, since it is possible to avoid the influence of an optical proximity effect differing depending on the gate patterns, it is possible to suppress an increase in the layout area resulting from the provision of the well potential supply region while reliably suppressing unevenness in the gate lengths.

Advantageous Effects of the Invention

According to the present invention, even when a well potential supply area is disposed, since it is possible to maintain regularity in the shapes of the peripheral gate patterns thereof, an increase in the layout area resulting from providing the well potential supply area can be suppressed while reliably suppressing unevenness in the gate length.

DESCRIPTION OF EMBODIMENTS

Hereinafter, embodiments of the present invention will be described in detail based on the drawings. Furthermore, in the present description, a "dummy gate" refers to a gate that does not constitute a transistor. In addition, a gate that functions as a gate of an active transistor refers to a "gate electrode". Furthermore, simply a "gate" refers to both the "dummy gate" and the "gate electrode".

First Exemplary Embodiment

Figure 1:
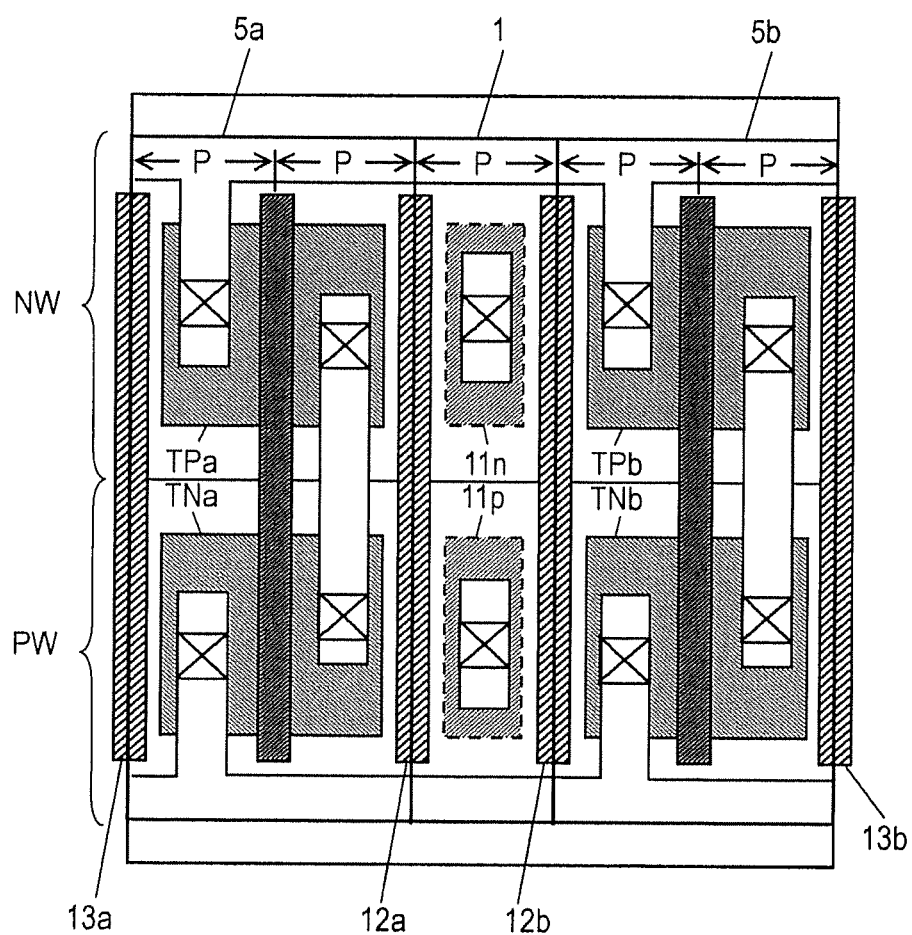
FIG. 1 is an example of the layout structure of a tap cell according to a first exemplary embodiment.
Figure 1:
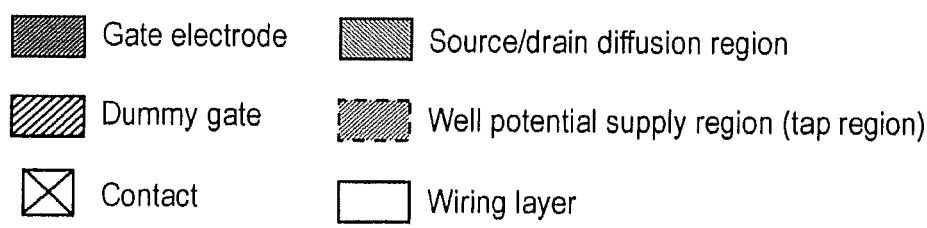

FIG. 1 is a drawing showing an example of the layout structure of a tap cell according to a first exemplary embodiment. Herein, a "tap cell" refers to a cell having a potential supply region to a well. In the layout structure of FIG. 1, tap cell 1 is closely disposed between logic cells 5*a* and 5*b* constituting an inverter.

In FIG. 1, tap cell 1 includes N-type impurity diffusion region 11*n* formed in N-type well region NW and P-type impurity diffusion region 11*p* formed in P-type well region PW. Desired well potential is supplied from N-type impurity diffusion region 11*n* to N-type well region NW via contacts and wiring. Desired well potential is supplied from P-type impurity diffusion region 11*p* to P-type well region PW via the contacts and wiring. In other words, N-type impurity diffusion region 11*n* and P-type impurity diffusion region 11*p* constitute a well potential supply region (TAP region).

Logic cells 5*a* and 5*b* respectively include PMOS transistors TPa and TPb formed in N-type well region NW and NMOS transistors TNa and TNb formed in P-type well region PW.

In addition, dummy gates 12*a* and 12*b* are respectively disposed between tap cell 1 and logic cells 5*a* and 5*b*. In addition, dummy gates 13*a* and 13*b* are respectively disposed in the boundaries of logic cells 5*a* and 5*b* in the opposite side to tap cell 1.

By disposing the dummy gates as above, a plurality of gates (including the dummy gates) extending in the vertical direction are laid out in the horizontal direction substantially at fixed pitch P, as shown in FIG. 1. In other words, by employing the layout structure of tap cell 1 as in FIG. 1, it is possible to secure regularity in the shapes of gate patterns even when tap cell 1 is disposed between logic cells 5*a* and 5*b*.

Figure 2:
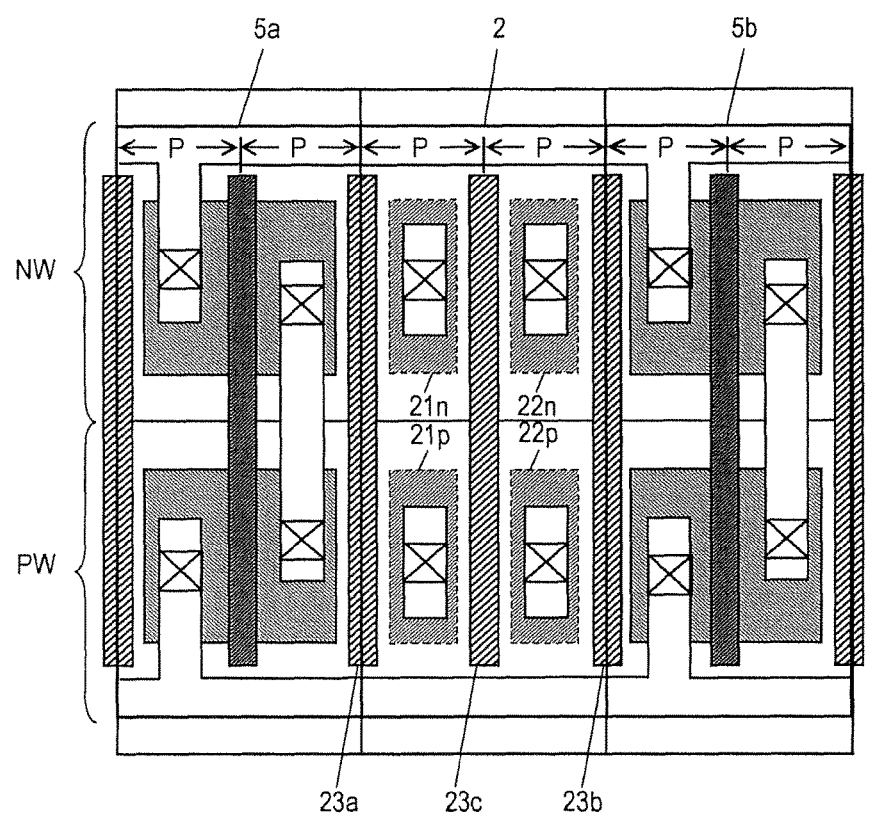
FIG. 2 is another example of the layout structure of the tap cell according to the first exemplary embodiment.
Figure 2:
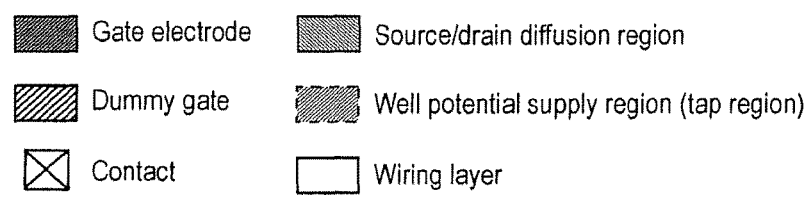

FIG. 2 is a diagram showing another example of the layout structure of the tap cell according to the first exemplary embodiment. In the layout structure of FIG. 2, tap cell 2 is closely disposed between logic cells 5a and 5b constituting an inverter. The layout structure of logic cells 5a and 5b is the same as that of FIG. 1.

In FIG. 2, tap cell 2 includes two N-type impurity diffusion regions 21n and 22n formed in N-type well region NW and two P-type impurity diffusion regions 21p and 22p formed in P-type well region PW. Desired well potential is supplied from N-type impurity diffusion regions 21n and 22n to N-type well region NW via contacts and wiring. Desired well potential is supplied from P-type impurity diffusion regions 21p and 22p to P-type well region PW via the contacts and wiring. In other words, two N-type impurity diffusion regions 21n and 22n and two P-type impurity diffusion regions 21p and 22p constitute a well potential supply region (TAP region).

In addition, dummy gates 23a and 23b are respectively disposed between tap cell 2 and logic cells 5a and 5b. Furthermore, dummy gate 23c is disposed between N-type impurity diffusion regions 21n and 22n and P-type impurity diffusion regions 21p and 22p.

By disposing the dummy gates as above, a plurality of gates (including the dummy gates) extending to the vertical direction are laid out in the horizontal direction substantially at fixed pitch P, as shown in FIG. 2. In other words, by employing the layout structure of tap cell 2 as in FIG. 2, it is possible to secure regularity in the shapes of gate patterns even when tap cell 2 is disposed between logic cells 5a and 5b.

Figure 3:
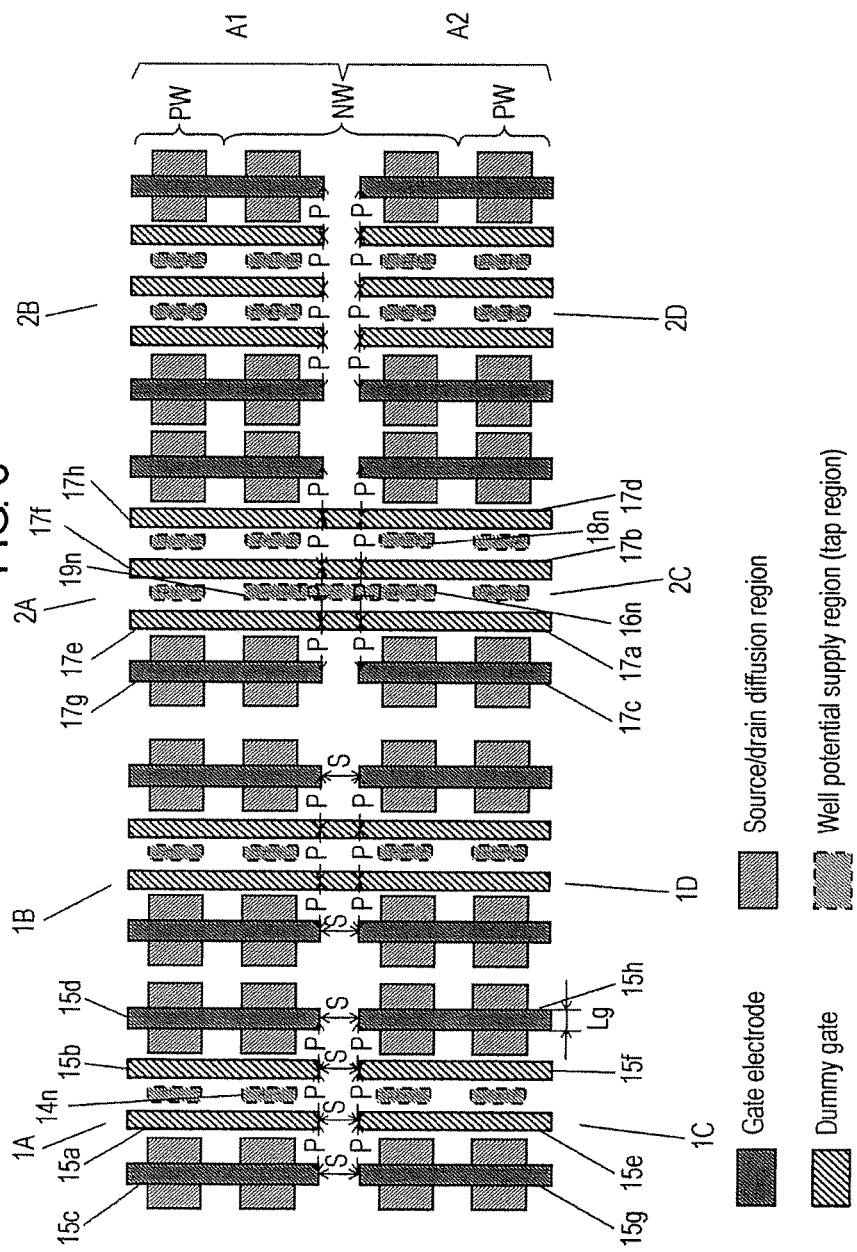
FIG. 3 is an example of the layout configuration of a semiconductor device using the tap cell of FIGS. 1 and 2.

FIG. 3 is an example of the layout structure of a semiconductor device using the tap cells shown in FIGS. 1 and 2. In the layout of FIG. 3, cell arrays A1 and A2 in which a plurality of gates extending in the vertical direction (first direction) are disposed by being arranged in the horizontal direction (second direction) are arranged in the vertical direction. In cell arrays A1 and A2, P-type well region PW and N-type well region NW extending in the horizontal direction are respectively formed below gates. Furthermore, in cell array A2, P-type well region PW and N-type well region NW are flipped so as to make N-type well regions NW of cell arrays A1 and A2 adjacent to each other.

In the layout structure of FIG. 3, tap cells 1A, 1B, 1C, and 1D having the same structure as tap cell 1 shown in FIG. 1 and tap cells 2A, 2B, 2C, and 2D having the same structure as tap cell 2 shown in FIG. 2 are disposed.

Herein, focus on N-type impurity diffusion region 14n in tap cell 1A disposed in cell array A1. N-type impurity diffusion region 14n functions as a well potential supply region that supplies well potential to N-type well region NW of cell array A1. In addition, dummy gates 15a and 15b are respectively disposed, as first and second adjacent gates, in both sides of N-type impurity diffusion region 14n in the horizontal direction as a first well potential supply region. Gate electrode 15c is closely disposed as a third adjacent gate in the opposite side to N-type impurity diffusion region 14n in the side of dummy gate 15a, and gate electrode 15d is closely disposed as a fourth adjacent gate in the opposite side to N-type impurity diffusion region 14n in the side of dummy gate 15b.

In addition, gate electrode 15c, dummy gates 15a and 15b, and gate electrode 15d are disposed in the horizontal direction at the same pitch P. Furthermore, cell array A2 as a first adjacent cell array includes four gates 15g, 15e, 15f, and 15h that are respectively opposed (at interval S) to gate electrode 15c, dummy gates 15a and 15b, and gate electrode 15d of cell array A1 in the vertical direction. In other words, the pattern of a total of four gates, two of which are adjacent in the horizontal direction, has regularity in the shapes in the focused N-type impurity diffusion region 14n.

In addition, focus on N-type impurity diffusion region 16n in tap cell 2C disposed in cell array A2. N-type impurity diffusion region 16n functions as a well potential supply region that supplies well potential to N-type well region NW of cell array A2. In addition, dummy gates 17a and 17b are respectively disposed, as the first and the second adjacent gates, in both sides of N-type impurity diffusion region 16n in the horizontal direction as the first well potential supply region. Gate electrode 17c is closely disposed as the third adjacent gate in the opposite side to N-type impurity diffusion region 16n in the side of dummy gate 17a, and gate electrode 17d is closely disposed as the fourth adjacent gate in the opposite side to N-type impurity diffusion region 16n in the side of dummy gate 17b. Furthermore, N-type impurity diffusion region 18n is formed between dummy gate 17b and dummy gate 17d as a second well potential supply region.

In addition, gate electrode 17c, and dummy gates 17a, 17b, and 17d are disposed in the horizontal direction at the same pitch P. Furthermore, cell array A1 as the first adjacent cell array includes four gates 17g, 17e, 17f, and 17h that are respectively opposed to gate electrode 17c, and dummy gates 17a, 17b, and 17d of cell array A2 in the vertical direction. In other words, the pattern of a total of four gates, two of which are adjacent in the horizontal direction, has regularity in the shapes in the focused N-type impurity diffusion region 16n.

Even when the well potential supply regions are disposed in such layouts, since it is possible to maintain regularity in the shape of the gate pattern around the region, it is possible to avoid the influence of an optical proximity effect differing from the gate patterns. Therefore, it is possible to suppress an increase in the layout area caused by the provision of the well potential supply regions while reliably suppressing unevenness in the gate length.

Furthermore, herein, description is provided focusing on the N-type impurity diffusion region that supplies well potential to the N-type well region, but the same configuration can be realized for the P-type impurity diffusion region that supplies well potential to the P-type well region, and thus the same operational effect is obtained.

Herein, "gates are disposed at the same pitch P" does not necessarily mean the pitch is perfectly the same, but the gates may be disposed substantially at the same pitch, allowing a certain degree of variation. For example, a variation up to about a half of pitch P (=P/2) is allowed. Alternatively, a variation up to gate width Lg is allowed.

In addition, the four gates adjacent to the well potential supply region and the four gates opposed thereto are preferably disposed substantially with the same interval. Furthermore, it may be possible that the gates are connected to the opposing gates forming one body as are dummy gates 17a, 17b, and 17d in tap cell 2C.

In addition, it may be possible that a well potential supply region is formed with a well potential supply region of the same conductive type in an adjacent cell array as one body. For example, N-type impurity diffusion region 16n in tap cell 2C may be formed as one body with N-type impurity diffusion region 19n as a third well potential supply region in tap cell 2A of cell array A1 as shown by dashed lines. By forming as above, impurity implantation for forming the well potential supply region becomes easier.

Furthermore, in the configurations of FIGS. 1 to 3, it is preferable that the widths of respective gates in the horizontal direction be the same in addition to the gates disposed at the same pitch P.

In addition, FIGS. 1 to 3 show that the sizes of the well potential supply regions in the vertical direction are the same as the gate widths (the width of the diffusion region) of adjacent transistors, but the invention is not limited thereto, and the sizes may be different from the gate widths of the transistors.

In addition, in FIGS. 1 to 3, each gate extends over the boundary of N-type well region NW and P-type well region PW, but may be disposed by being divided at the boundary. Furthermore, it may be possible that gates are divided and disposed in N-type well region NW or P-type well region PW after taking the influence of a proximity effect into consideration.

In addition, a well potential supply region may be disposed by being interposed between gates, and the size of the region in the vertical direction and the horizontal direction is not particularly restricted.

Figure 4A:
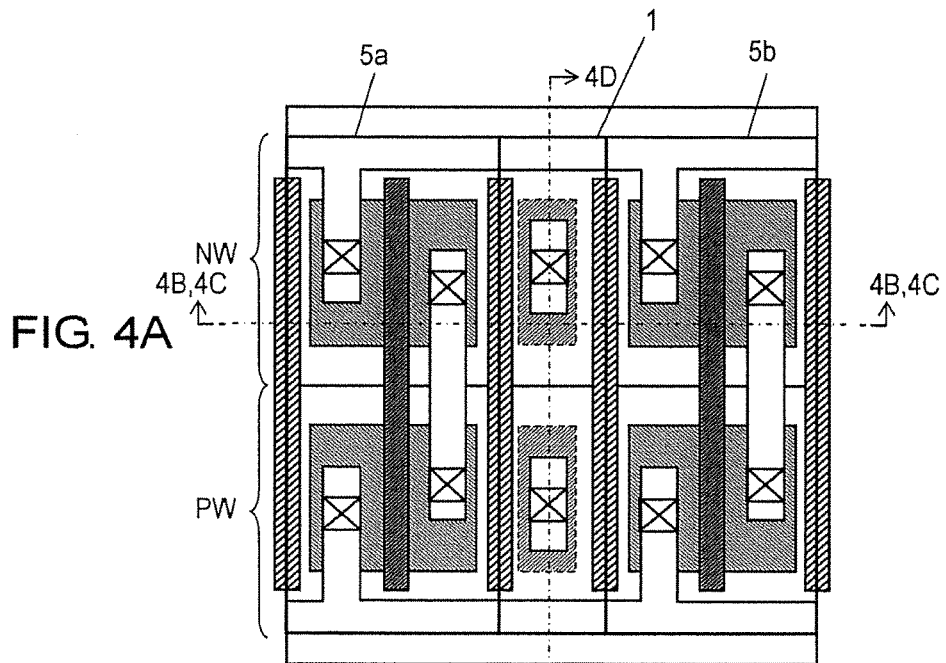
FIG. 4A is a diagram showing the plane structure of the tap cell.
Figure 4B:
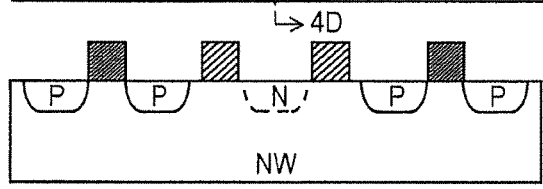
FIG. 4B is a diagram showing the cross-sectional structure of FIG. 4A.
Figure 4C:
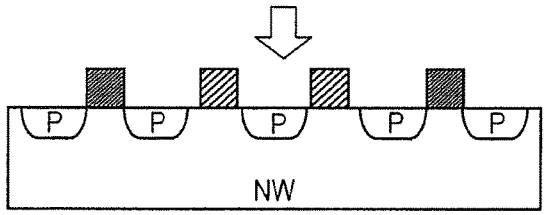
FIG. 4C is a diagram showing the cross-sectional structure of FIG. 4A.
Figure 4D:
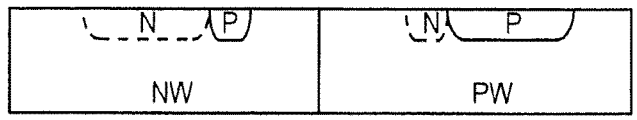
FIG. 4D is a diagram showing the cross-sectional structure of FIG. 4A.

FIG. 4A is the same plane diagram as FIG. 1, FIGS. 4B and 4C are diagrams showing the cross-sectional structure of FIG. 4A, and FIG. 4D is a diagram showing the cross-sectional structure of FIG. 4A. When the structure of the tap cell is employed as in FIG. 1, the widths of well potential supply regions 11n and 11p in the horizontal direction are minute, there is a possibility that impurities are not necessarily well implanted. In other words, as shown in FIG. 4B, ideally, it is preferable that impurities of the same conductive type (N-type in the drawing) as that of a well region be implanted into a well potential supply region interposed between dummy gates. In an actual manufacturing process, however, as shown in FIGS. 4C and 4D, impurities of a different conductive type (P-type in the drawings) that are implanted in an adjacent diffusion region are implanted into the well potential supply region, and for that reason, there is a possibility that the well potential supply regions are not properly formed between the dummy gates.

Figure 5A:
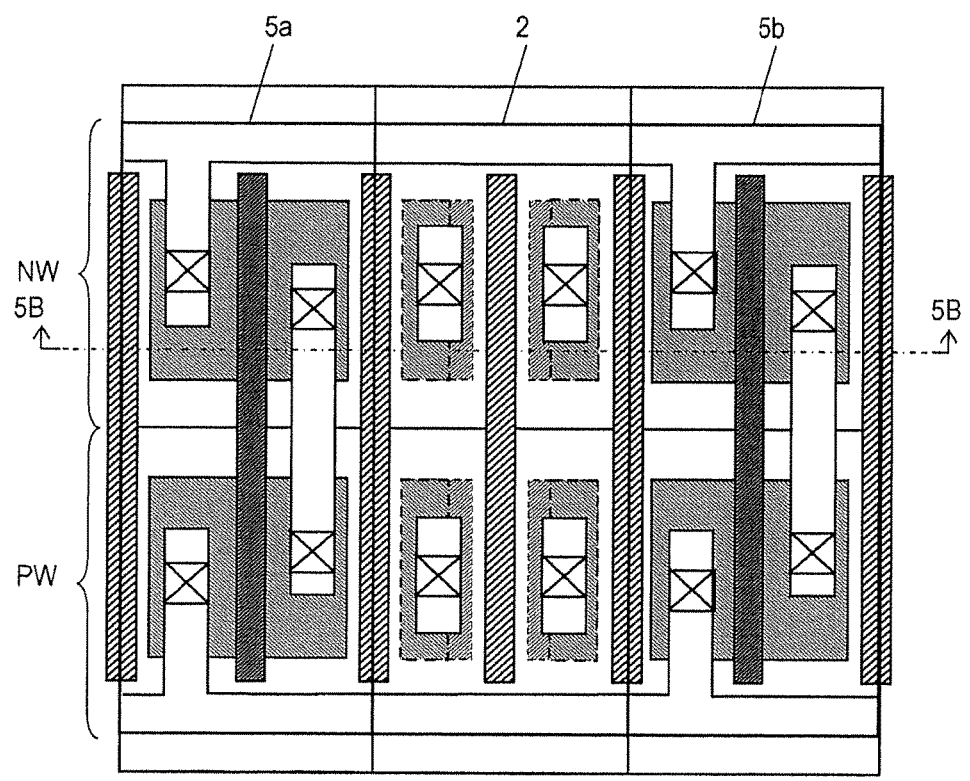
FIG. 5A is a diagram showing the plane structure of the tap cell.
Figure 5B:
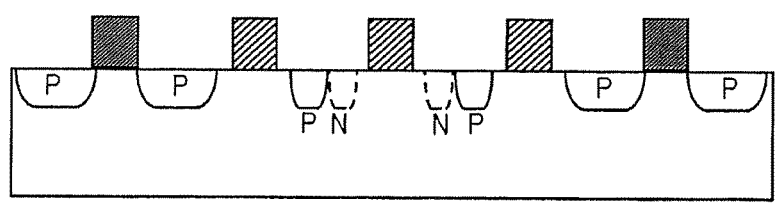
FIG. 5B is a diagram showing the cross-sectional structure of FIG. 5A.

FIG. 5A is the same plane diagram as in FIG. 2, and FIG. 5B is a diagram showing the cross-sectional structure of FIG. 5A. When the structure of the tap cell is employed as in FIG. 2, even in a case where impurities of a different conductive type (P-type in the drawing) that are implanted the adjacent diffusion region are implanted to the well potential supply regions as shown in FIG. 5B, the well potential supply regions of the same conductive type (N-type in the drawing) as that of the well regions are formed between the dummy gates.

Second Exemplary Embodiment

Figure 6:
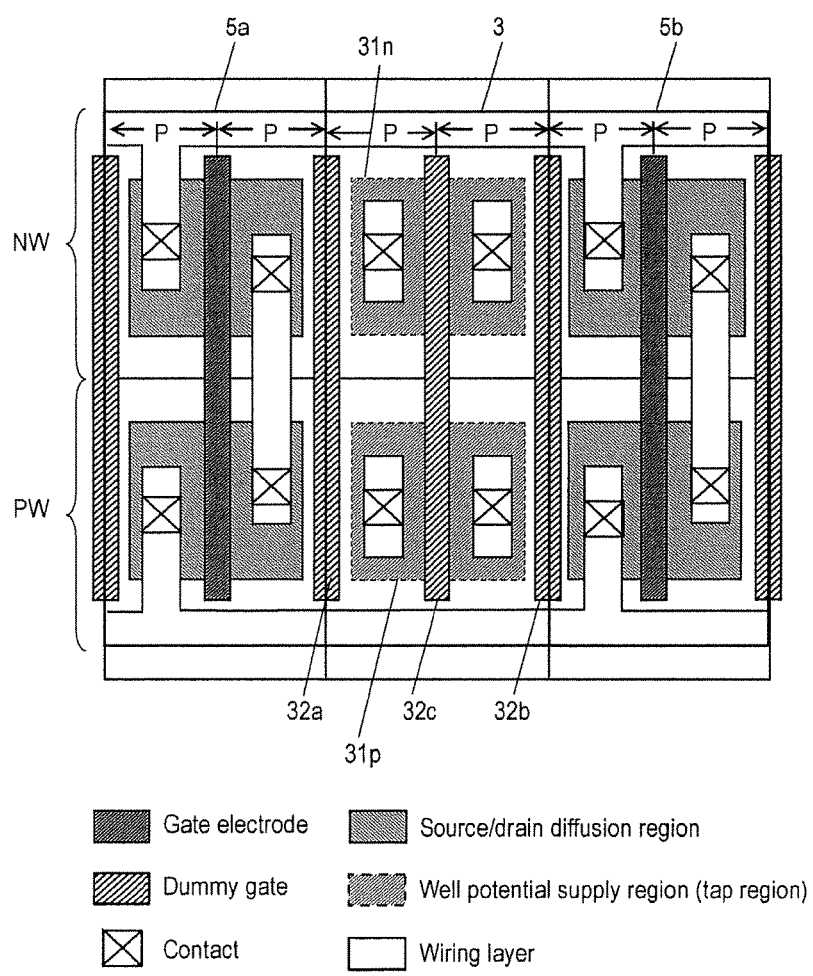
FIG. 6 is an example of the layout structure of a tap cell according to a second exemplary embodiment.

FIG. 6 is a diagram showing an example of the layout structure of a tap cell according to a second exemplary embodiment. In the layout structure of FIG. 6, tap cell 3 is closely disposed between logic cells 5a and 5b constituting an inverter. The layout structure of logic cells 5a and 5b is the same as in FIG. 1.

In FIG. 6, tap cell 3 includes N-type impurity diffusion region 31n formed in N-type well region NW and P-type impurity diffusion region 31p formed in P-type well region PW. Desired well potential is supplied from N-type impurity diffusion region 31n to N-type well region NW via contacts and wiring. Desired well potential is supplied from P-type impurity diffusion region 31p to P-type well region PW via the contacts and wiring. In other words, N-type impurity diffusion region 31n and P-type impurity diffusion region 31p constitute a well potential supply region (TAP region).

In addition, dummy gates 32a and 32b are respectively disposed between tap cell 3 and logic cells 5a and 5b. Furthermore, dummy gate 32c is disposed over N-type impurity diffusion region 31n and P-type impurity diffusion region 31p. In other words, N-type impurity diffusion region 31n and P-type impurity diffusion region 31p form a so-called transistor-type well potential supply region.

By disposing the dummy gates as above, a plurality of gates (including the dummy gates) extending in the vertical direction are laid out in the horizontal direction substantially at fixed pitch P, as shown in FIG. 6. In other words, by employing the layout structure of tap cell 3 as shown in FIG. 6, even when tap cell 3 is disposed between logic cells 5a and 5b, it is possible to secure regularity in the shape of gate patterns.

Figure 7:
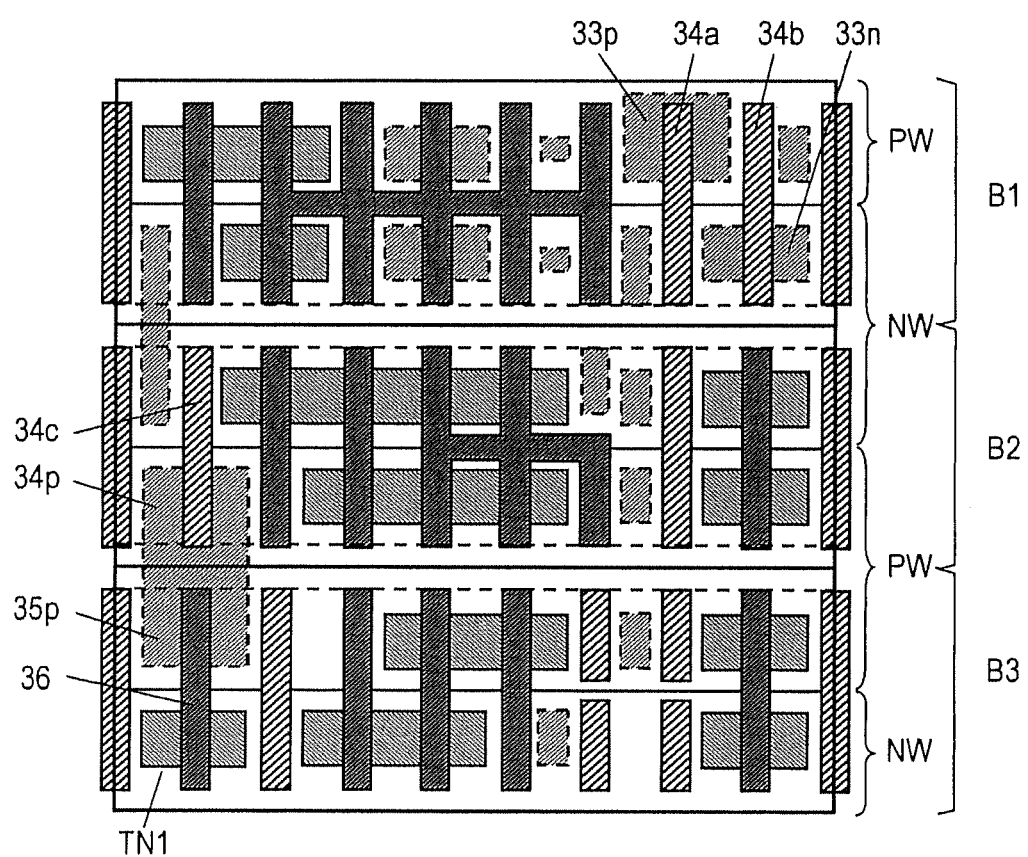
FIG. 7 is an example of the layout structure of a semiconductor device using a transistor-type well potential supply region shown in FIG. 6.

FIG. 7 is an example of the layout structure of a semiconductor device using the transistor-type well potential supply region shown in FIG. 6. In the layout of FIG. 7, cell arrays B1, B2, and B3, in which a plurality of gates extending in the vertical direction (first direction) are arranged and disposed in the horizontal direction (second direction), are arranged and disposed in the vertical direction. In cell arrays B1, B2, and B3, P-type well regions PW and N-type well regions NW extending in the horizontal direction are respectively formed below the gates. Furthermore, in cell array B2, P-type well region PW and N-type well region NW are flipped so as to make N-type well regions NW of cell arrays B1 and B2 adjacent to each other and make P-type well regions PW of cell arrays B2 and B3 adjacent to each other.

In the layout structure of FIG. 7, as a first transistor-type well potential supply region, P-type impurity diffusion regions 33p and 34p and N-type impurity diffusion region 33n are provided. P-type impurity diffusion region 33p performs power-supply to P-type well region PW of cell array B1, N-type impurity diffusion region 33n performs power-supply to N-type well region NW of cell array B1, and P-type impurity diffusion region 34p performs power-supply to P-type well region PW of cell array B2. In addition, dummy gate 34a as a first gate on P-type impurity diffusion regions 33p, dummy gate 34b as the first gate on N-type impurity diffusion region 33n, and dummy gate 34c as the first gate on P-type impurity diffusion regions 34p are respectively disposed.

With the layout as above, since it is possible to maintain regularity in the shape of gate patterns around well potential supply regions even when the regions are disposed, it is possible to avoid the influence of an optical proximity effect differing depending on the gate patterns. Therefore, it is possible to suppress an increase in the area resulting from the provision of the well potential supply regions for controlling well potential and preventing latch-up while reliably suppressing unevenness in the gate lengths.

Furthermore, it may be possible that the gates disposed on the transistor-type well potential supply region may be gate electrodes functioning as gates of active transistors. In the layout of FIG. 7, on P-type impurity diffusion region 35p as the first well potential supply region that performs power-supply to P-type well region PW of cell array B3, gate electrode 36 is disposed as the first gate extending from active transistor TN1 below P-type impurity diffusion region 35p.

ANOTHER EXAMPLE OF LAYOUT STRUCTURE

Example 1

Figure 8:
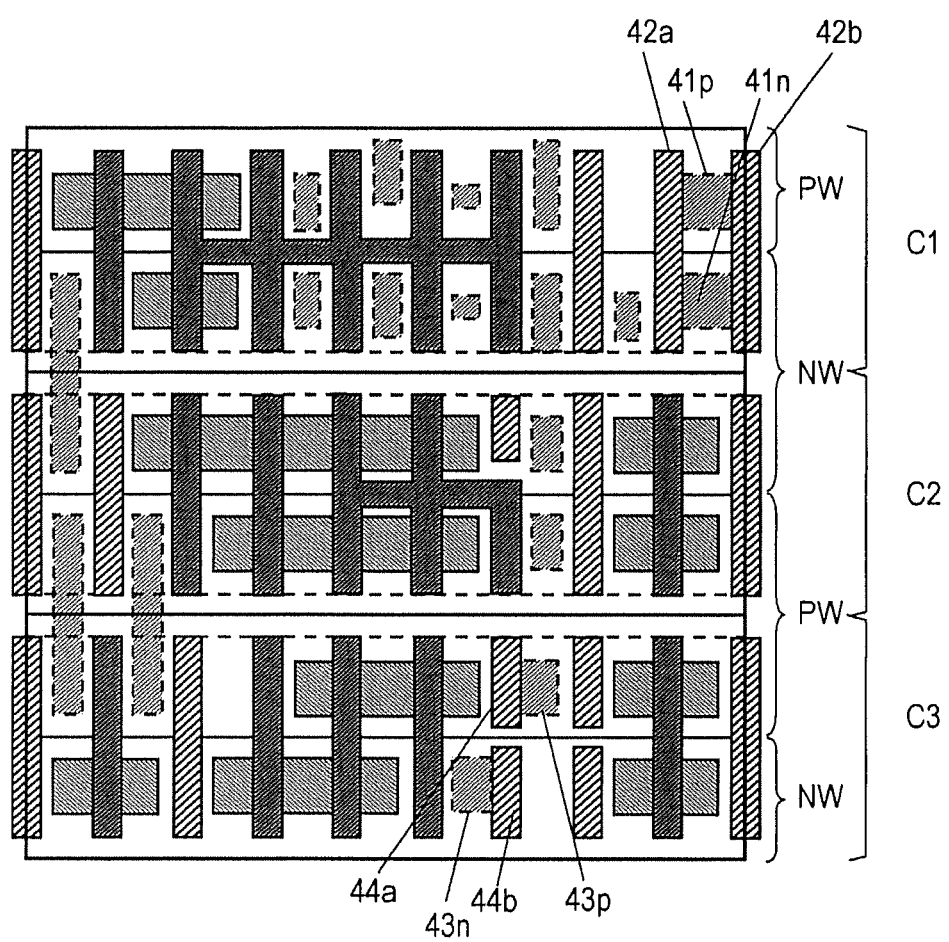
FIG. 8 is another example of the layout structure of the semiconductor device.

FIG. 8 is another example of the layout structure of the semiconductor device. In the layout of FIG. 8, cell arrays C1, C2, and C3, in which a plurality of gates extending in the vertical direction are arranged and disposed in the horizontal direction, are arranged and disposed in the vertical direction in the same manner as in FIG. 7. In cell arrays C1, C2, and C3, P-type well regions PW and N-type well regions NW extending in the horizontal direction are respectively formed below the gates. Furthermore, in cell array C2, P-type well region PW and N-type well region NW are flipped so as to make N-type well regions NW of cell arrays C1 and C2 adjacent to each other and make P-type well regions PW of cell arrays C2 and C3 adjacent to each other.

One of the characteristics of the layout structure of FIG. 8 is P-type impurity diffusion region 41p and N-type impurity diffusion region 41n. P-type impurity diffusion region 41p performs power-supply to P-type well region PW of cell array C1 and N-type impurity diffusion region 41n performs power-supply to N-type well region NW of cell array C1. In addition, both of P-type impurity diffusion region 41p and N-type impurity diffusion region 41n are disposed below dummy gates 42a and 42b in both sides of the regions in an overlapping manner. Since it is possible to increase the widths of the impurity diffusion regions in the horizontal direction by allowing such disposition, an effect is obtained in which implantation of impurities becomes easier in the manufacturing process.

In addition, P-type impurity diffusion region 43p that performs power-supply to P-type well region PW of cell array C3 is disposed under dummy gate 44a in one side of the region in an overlapping manner. Similarly, N-type impurity diffusion region 43n that performs power-supply to N-type well region NW of cell array C3 is disposed under dummy gate 44b in one side of the region in an overlapping manner. Even in the disposition as above, it is possible to increase the widths of the impurity diffusion regions in the horizontal direction.

Example 2

Figure 9:
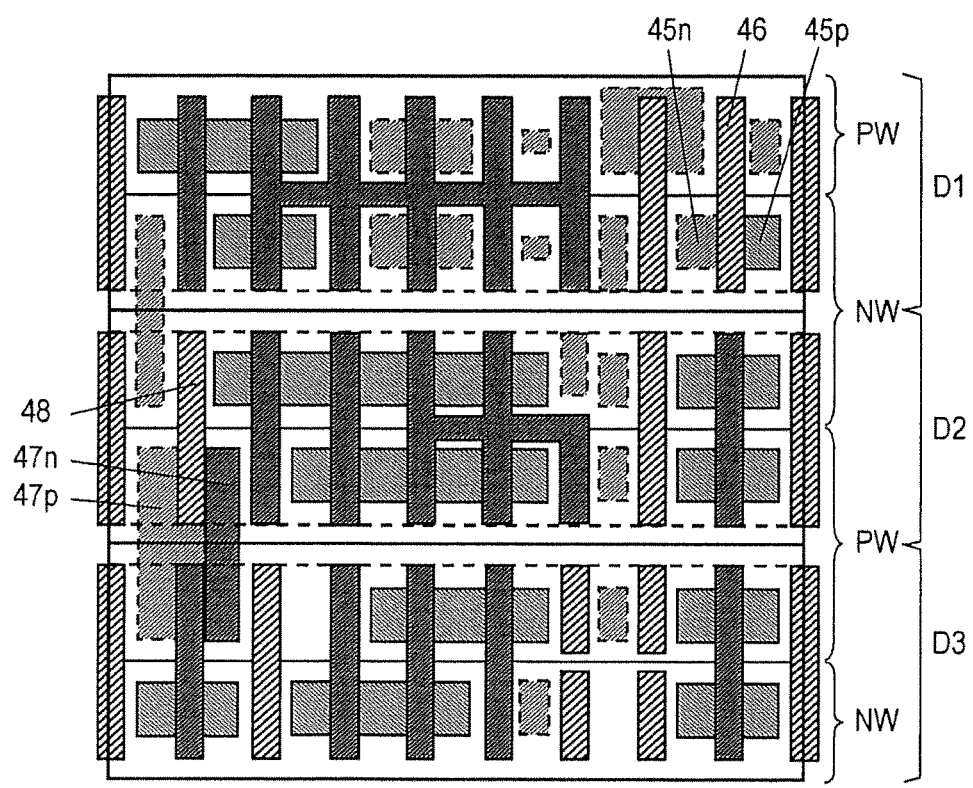
FIG. 9 is another example of the layout structure of the semiconductor device.

FIG. 9 is another example of the layout structure of the semiconductor device. In the layout of FIG. 9, cell arrays D1, D2, and D3 in which a plurality of gates extending in the vertical direction are arranged and disposed in the horizontal direction are arranged and disposed in the vertical direction in the same manner as in FIG. 7. In cell arrays D1, D2, and D3, P-type well regions PW and N-type well regions NW extending in the horizontal direction are respectively formed below gates. Furthermore, in cell array D2, P-type well region PW and N-type well region NW are flipped so as to make N-type well regions NW of cell arrays D1 and D2 adjacent to each other, and to make P-type well regions PW of cell arrays D2 and D3 adjacent to each other.

One of the characteristics of the layout structure of FIG. 9 is that impurities of a different conductive type from that of the well regions are implanted into either of the diffusion regions interposing the dummy gates in the transistor-type well potential supply region. For example, dummy gate 46 is disposed by being interposed between N-type impurity diffusion region 45n and P-type impurity diffusion region 45p in N-type well region NW of cell array D1. In addition, dummy gate 48 is disposed by being interposed between P-type impurity diffusion region 47p and N-type impurity diffusion region 47n in P-type well region PW of cell array D2.

For example, by disposing P-type impurity diffusion region 45p, it is possible to reliably implant impurities into the P-type impurity diffusion regions that serve as drains or sources of PMOS transistors disposed in the right side thereof without causing an operational problem. By setting either of the diffusion regions interposing the dummy gate to an impurity diffusion region of a different conductive type from that of the well region in the transistor-type well potential supply region, it is possible to reliably form a diffusion region of an adjacent transistor thereto.

Example 3

The description hitherto shows an example in which adjacent gates disposed in both sides of a well potential supply region are dummy gates. In the present exemplary embodiment, however, it may be possible that adjacent gates disposed in both sides of a well potential supply region are gates functioning as gate electrodes of active transistors.

Figure 10:
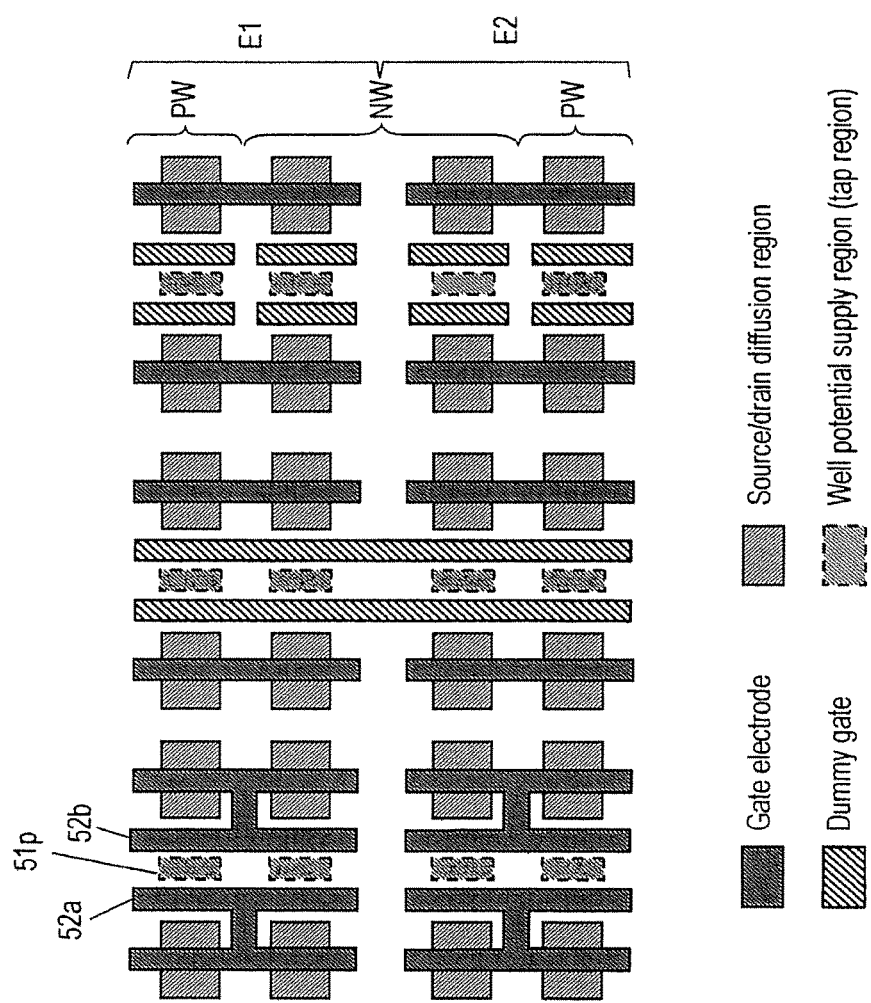
FIG. 10 is another example of the layout structure of the semiconductor device.
Figure 11:
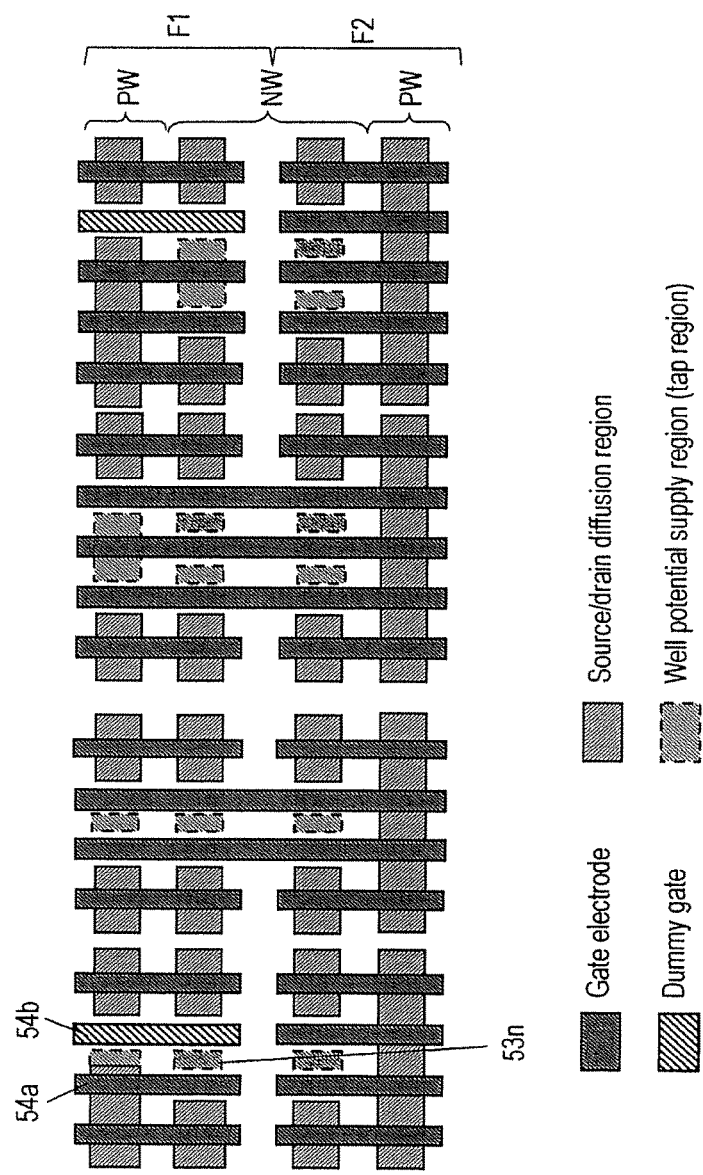
FIG. 11 is another example of the layout structure of the semiconductor device.
Figure 12:
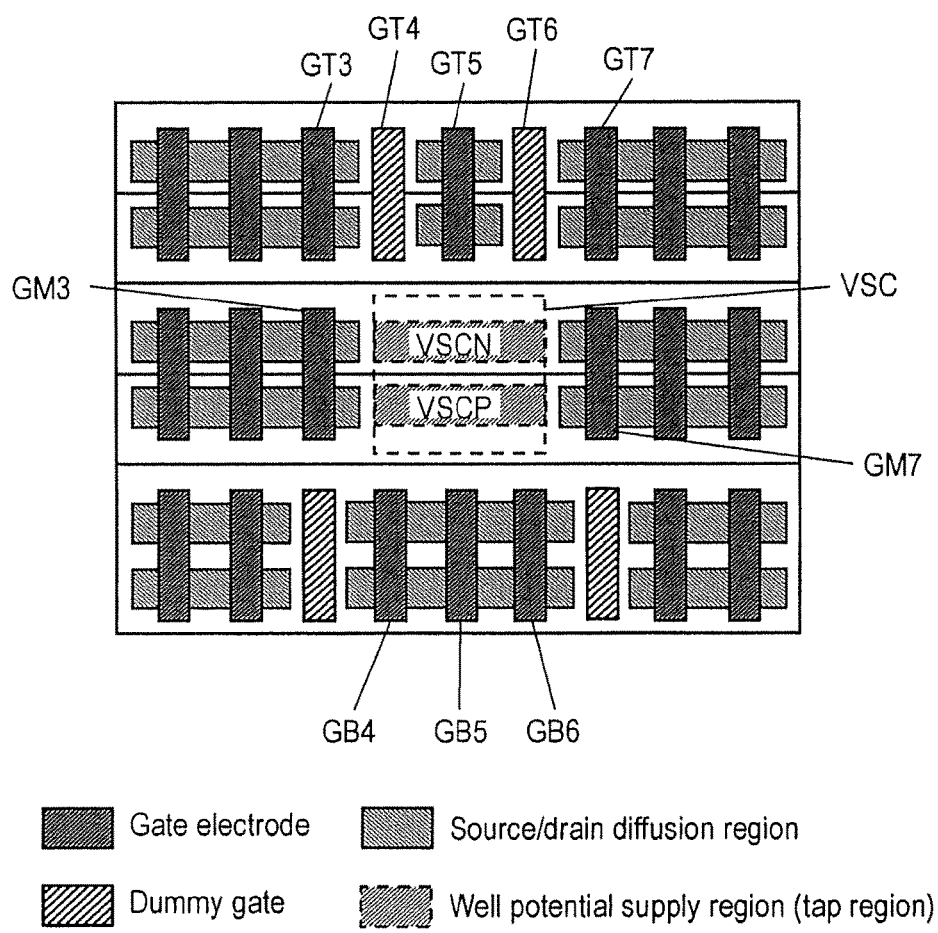
FIG. 12 is an example of the layout of a semiconductor device.

FIGS. 10 and 11 are other examples of the layout structure of the semiconductor device. In the layout of FIG. 10, cell arrays E1 and E2 in which a plurality of gates extending in the vertical direction are arranged and disposed in the horizontal direction are arranged and disposed in the vertical direction. In cell array E1 and E2, P-type well regions PW and N-type well regions NW extending in the horizontal direction are respectively formed below gates. Furthermore, in cell array E2, P-type well region PW and N-type well region NW are flipped so as to make N-type well regions NW of cell arrays E1 and E2 adjacent to each other. Cell arrays F1 and F2 are disposed also in the layout of FIG. 11 in the same manner.

For example, in FIG. 10, gate electrodes 52a and 52b are adjacent to each other, as first and second adjacent gates functioning as gates of active transistors, in P-type impurity diffusion region 51p that serves as a first well potential supply region. In addition, in FIG. 11, gate electrode 54a as the first adjacent gate functioning as the gate of the active transistor and dummy gate 54b as the second adjacent gate are adjacent to each other in N-type impurity diffusion region 53n that serves as the first well potential supply region.

Furthermore, in the above-described layout of the semiconductor device, impurity diffusion regions of the same conductive type as that of the well regions, which extend in the horizontal direction may be provided between the cell arrays. In the layout of FIG. 7, for example, it may be possible that an N-type impurity diffusion region extending in the horizontal direction is provided between cell arrays B1 and B2, and a P-type impurity diffusion region extending in the horizontal direction is provided between cell arrays B2 and B3. For example, by using the impurity diffusion regions provided between the cell arrays in power-supply to the well regions, it is possible to further stabilize the potential of the well regions.

Alternatively, in the above-described layout of the semiconductor device, an impurity diffusion region of a different conductive type from that of a well region, which extends in the horizontal direction, may be provided between cell arrays. For example, it may be possible that, in the layout of FIG. 7, a P-type impurity diffusion region extending in the horizontal direction is provided between cell arrays B1 and B2, and an N-type impurity diffusion region extending in the horizontal direction is provided between cell arrays B2 and B3. By using the impurity diffusion regions provided between the cell arrays in, for example, the supply of power source potential or substrate potential, it is possible to further stabilize source potential of a transistor.

In the present invention, since a semiconductor device having well potential supply regions can be realized while reliably suppressing unevenness in the gate lengths caused by the optical proximity effect without increasing the layout area, the invention is effective in, for example, improving the yield and miniaturization of a semiconductor chip.

What is claimed is:

1. A semiconductor device comprising:
   a plurality of cell arrays arranged sequentially in a first direction, each of the plurality of cell arrays including
     a plurality of gates extending in the first direction and arranged in a second direction orthogonal to the first direction,
   wherein each of the plurality of cell arrays includes a first conductive type well region and a second conductive type region extending in the second direction and formed below the plurality of gates,
   wherein a first cell array of the plurality of cell arrays includes:
     a first well potential supply region in the first conductive type well region, the first well potential supply region including impurities of same conductive type as the first conductive type well region;
     a second potential supply region in the second conductive type region, the second potential supply region including impurities of same conductive type as the second conductive type region; and
     first, second and third adjacent gates of the plurality of gates, the first, second and third adjacent gates being disposed at the same pitch in the second direction,
   wherein a portion of the first well potential supply region is disposed between the first adjacent gate and the second adjacent gate, and the third adjacent gate is disposed adjacent to the first adjacent gate, and no portion of the second potential supply region is disposed between the first adjacent gate and the second adjacent gate,
   wherein a second cell array of the plurality of cell arrays adjacent to the first cell array in the first direction includes fourth, fifth and sixth adjacent gates, the fourth, fifth and sixth adjacent gates being opposed to the first, second and third adjacent gates of the first cell array in the first direction, respectively,
   wherein the first, second, and third adjacent gates of the first cell array are dummy gates.

2. The semiconductor device of claim 1, wherein a portion of the first well potential supply region is disposed between the first adjacent gate and the third adjacent gate.

3. The semiconductor device of claim 1, wherein the first adjacent gate overlaps a portion of the first well potential supply region.

4. The semiconductor device of claim 1, wherein at least one of the fifth and sixth adjacent gates are dummy gates.

5. The semiconductor device of claim 4, wherein both of the fifth and sixth adjacent gates are dummy gates.

6. The semiconductor device of claim 1, wherein the first conductive type well region is an N-type well region.

7. A semiconductor device comprising:
   a plurality of cell arrays arranged sequentially in a first direction, each of the plurality of cell arrays including
     a plurality of gates extending in the first direction and arranged in a second direction orthogonal to the first direction,
   wherein each of the plurality of cell arrays includes a first conductive type well region and a second conductive type region extending in the second direction and formed below the plurality of gates,
   wherein a first cell array of the plurality of cell arrays includes:
     a first well potential supply region in the first conductive type well region, the first well potential supply region including impurities of same conductive type as the first conductive type well region;
     a second potential supply region in the second conductive type region, the second potential supply region including impurities of same conductive type as the second conductive type region; and
     first, second and third adjacent gates of the plurality of gates, the first, second and third adjacent gates being disposed at the same pitch in the second direction,
   wherein a portion of the first well potential supply region is disposed between the first adjacent gate and the second adjacent gate, and the third adjacent gate is disposed adjacent to the first adjacent gate, and no portion of the second potential supply region is disposed between the first adjacent gate and the second adjacent gate,
   wherein a second cell array of the plurality of cell arrays adjacent to the first cell array in the first direction includes fourth, fifth and sixth adjacent gates, the fourth, fifth and sixth adjacent gates being opposed to the first, second and third adjacent gates of the first cell array in the first direction, respectively,
   wherein the first, second, and third adjacent gates of the first cell array are dummy gates, and
   wherein the fourth adjacent gate of the second cell array is a gate electrode of an active transistor.

8. The semiconductor device of claim 7, wherein a portion of the first well potential supply region is disposed between the first adjacent gate and the third adjacent gate.

9. The semiconductor device of claim 7, wherein the first adjacent gate overlaps a portion of the first well potential supply region.

10. The semiconductor device of claim 7, wherein at least one of the fifth and sixth adjacent gates are dummy gates.

11. The semiconductor device of claim 10, wherein both of the fifth and sixth adjacent gates are dummy gates.

12. The semiconductor device of claim 7, wherein the first conductive type well region is an N-type well region.

13. A semiconductor device comprising:
   a plurality of cell arrays arranged sequentially in a first direction, each of the plurality of cell arrays including
     a plurality of gates extending in the first direction and arranged in a second direction orthogonal to the first direction,
   wherein each of the plurality of cell arrays includes a first conductive type well region and a second conductive type region extending in the second direction and formed below the plurality of gates,
   wherein a first cell array of the plurality of cell arrays includes:
     a first well potential supply region in the first conductive type well region, the first well potential supply region including impurities of same conductive type as the first conductive type well region;
     a second potential supply region in the second conductive type region, the second potential supply region including impurities of same conductive type as the second conductive type region; and first, second and third adjacent gates of the plurality of gates, the first, second and third adjacent gates being disposed at the same pitch in the second direction, wherein a portion of the first well potential supply region is disposed between the first adjacent gate and the second adjacent gate, and the third adjacent gate is disposed adjacent to the first adjacent gate, and no portion of the second potential supply region is disposed between the first adjacent gate and the second adjacent gate, wherein a second cell array of the plurality of cell arrays adjacent to the first cell array in the first direction includes fourth, fifth and sixth adjacent gates, the fourth, fifth and sixth adjacent gates being opposed to the first, second and third adjacent gates of the first cell array in the first direction, respectively, wherein the first, second, and third adjacent gates of the first cell array are dummy gates, and wherein the fourth adjacent gate of the second cell array is a gate electrode of a first active transistor in a first conductive type well region and a second active transistor in a second conductive type region.

14. The semiconductor device of claim 13, wherein a portion of the first well potential supply region is disposed between the first adjacent gate and the third adjacent gate.

15. The semiconductor device of claim 13, wherein the first adjacent gate overlaps a portion of the first well potential supply region.

16. The semiconductor device of claim 13, wherein at least one of the fifth and sixth adjacent gates are dummy gates.

17. The semiconductor device of claim 16, wherein both of the fifth and sixth adjacent gates are dummy gates.

18. The semiconductor device of claim 13, wherein the first conductive type well region is an N-type well region.

* * * * *